(12) United States Patent
Sakuma et al.

(10) Patent No.: US 9,281,489 B2
(45) Date of Patent: Mar. 8, 2016

(54) ORGANIC LUMINESCENT MATERIALS, COATING SOLUTION USING ORGANIC LUMINESCENT MATERIALS FOR ORGANIC EMITTING LAYER, ORGANIC LIGHT EMITTING DEVICE USING COATING SOLUTION, LIGHT SOURCE DEVICE USING ORGANIC LIGHT EMITTING DEVICE AND METHOD OF ORGANIC LIGHT EMITTING DEVICE

(75) Inventors: Hirotaka Sakuma, Hitachinaka (JP); Sukekazu Aratani, Hitachiota (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 13/817,960

(22) PCT Filed: Sep. 10, 2010

(86) PCT No.: PCT/JP2010/005530
§ 371 (c)(1),
(2), (4) Date: Apr. 26, 2013

(87) PCT Pub. No.: WO2012/032578
PCT Pub. Date: Mar. 15, 2012

(65) Prior Publication Data
US 2013/0221337 A1   Aug. 29, 2013

(51) Int. Cl.
*H01L 51/50* (2006.01)
*H01L 51/00* (2006.01)
*C09K 11/06* (2006.01)
*H05B 33/14* (2006.01)

(52) U.S. Cl.
CPC ............ *H01L 51/5012* (2013.01); *C09K 11/06* (2013.01); *H01L 51/0085* (2013.01); *H01L 51/5036* (2013.01); *H05B 33/14* (2013.01); *C09K 2211/185* (2013.01); *H01L 51/5004* (2013.01); *H01L 2251/5346* (2013.01)

(58) Field of Classification Search
CPC ......... H01L 51/50; H01L 51/52; H01L 51/54; H01J 1/62; H01J 63/04
See application file for complete search history.

(56) References Cited

U.S. PATENT DOCUMENTS

| 2005/0196637 | A1 | 9/2005 | Herron |
| 2006/0125379 | A1 | 6/2006 | Liu et al. |
| 2006/0214553 | A1* | 9/2006 | Nagara et al. ................. 313/483 |
| 2007/0001587 | A1* | 1/2007 | Hatwar et al. ................ 313/504 |
| 2007/0259205 | A1 | 11/2007 | Ionkin et al. |
| 2009/0206743 | A1 | 8/2009 | Oda et al. |
| 2010/0140605 | A1 | 6/2010 | Shibata et al. |

FOREIGN PATENT DOCUMENTS

| EP | 1784056 A1 | 5/2007 |
| EP | 2354207 A1 | 8/2011 |

(Continued)

*Primary Examiner* — Fernando L Toledo
*Assistant Examiner* — Lawrence-Linh T Nguyen
(74) *Attorney, Agent, or Firm* — Volpe and Koenig, P.C.

(57) ABSTRACT

The objects of the present invention are to provide an organic luminescent material capable of being easily controlled for dopant concentrations. The present invention is characterized in that a organic light-emitting device comprising a upper electrode, a lower electrode; and a light-emitting layer positioned between the upper electrode and the lower electrode, wherein the light-emitting layer contains a host, a first dopant and a second dopant, the first dopant is a blue-light-emitting dopant or a green-light-emitting dopant, the first dopant has a first functional group, and the first functional group makes the first dopant transfer toward the surface of the light-emitting layer on the upper electrode side in the light-emitting layer.

14 Claims, 9 Drawing Sheets

(56) References Cited

FOREIGN PATENT DOCUMENTS

| JP | 09-063770 A | 3/1997 |
| JP | 2009-114369 A | 5/2009 |
| JP | 2009-194166 A | 8/2009 |
| JP | 2009-536681 A | 10/2009 |
| JP | 2010-034484 A | 2/2010 |
| JP | 2010-135689 A | 6/2010 |

* cited by examiner

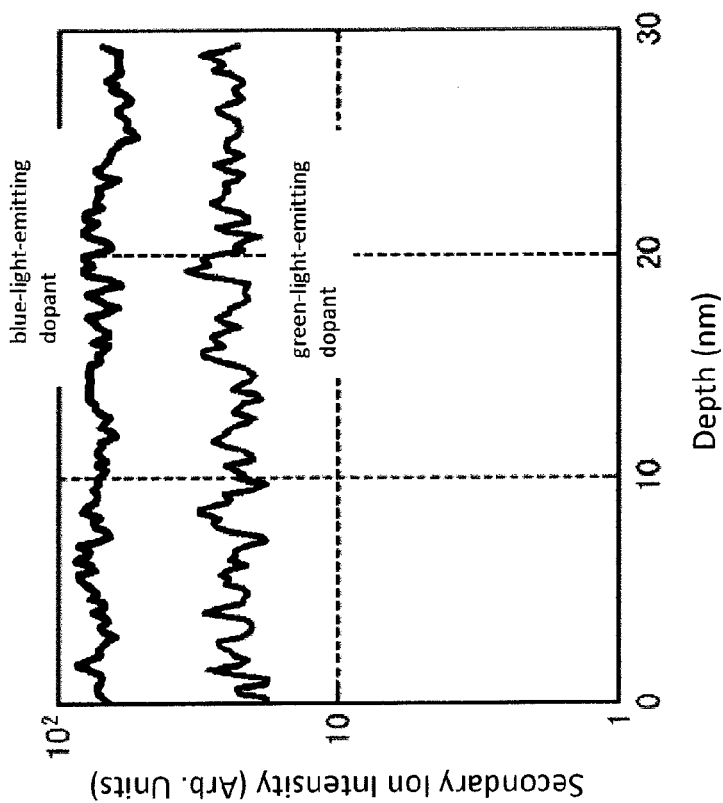
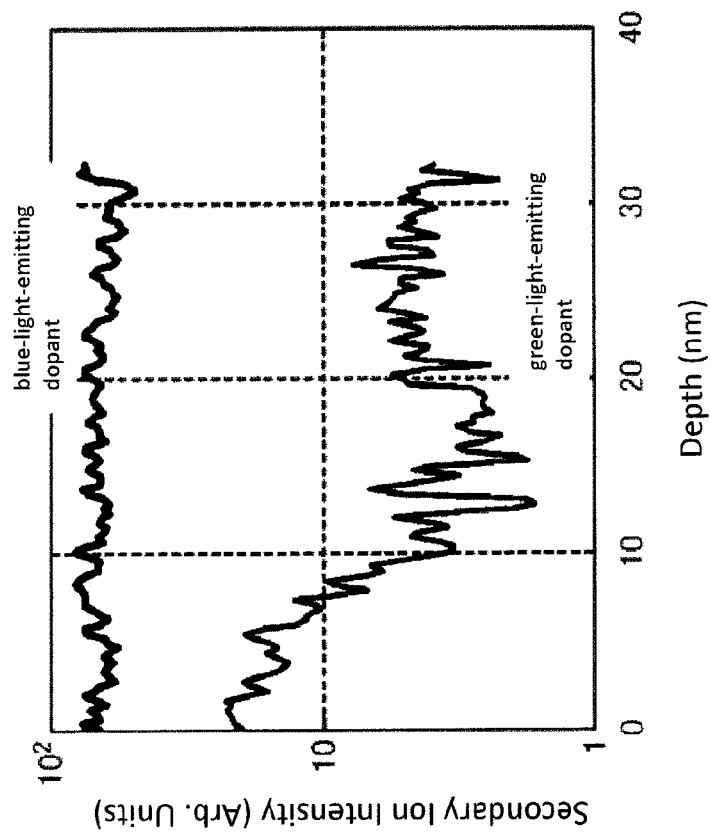
FIG. 9(A)
FIG. 9(B)

ORGANIC LUMINESCENT MATERIALS, COATING SOLUTION USING ORGANIC LUMINESCENT MATERIALS FOR ORGANIC EMITTING LAYER, ORGANIC LIGHT EMITTING DEVICE USING COATING SOLUTION, LIGHT SOURCE DEVICE USING ORGANIC LIGHT EMITTING DEVICE AND METHOD OF ORGANIC LIGHT EMITTING DEVICE

BACKGROUND OF THE INVENTION

1. Field of the Invention

The present invention relates to an organic luminescent material, coating solution using the organic luminescent material for organic light-emitting layer, organic light-emitting device using the coating solution and light source device using the organic light-emitting device.

2. Description of the Related Art

For organic white-light-emitting devices with a single light-emitting layer, Patent Document 1 discloses an organic EL device with a single light-emitting layer of a composition of at least (a) polymer and (b) compound for forming a light-emitting center, placed between electrodes. The composition contains an electron transport material and hole transport material in a well-balanced manner. The polymer itself emits blue or shorter wavelength colors, and is dispersed with at least two species of compounds for forming a light-emitting center, each individually emitting a color, where a combination of these compounds is selected in such a way that the organic EL device as a whole emits white color.

[Patent document 1] JP-A-H9-63770

The conventional method for producing an organic light-emitting device involves a disadvantage of difficulty in easily controlling the concentration of dopants which have various colors without causing their phase separation:

The objects of the present invention are to provide an organic luminescent material capable of being easily controlled for dopant concentrations, coating solution using the organic luminescent material for organic light-emitting layer, organic light-emitting device using the coating solution, light source device using the organic light-emitting device and method of the organic light-emitting device.

SUMMARY OF THE INVENTION

To solve the above problem, the feature of the present invention is as below.

(1) A organic light-emitting device comprising a upper electrode,
a lower electrode and a light-emitting layer positioned between the upper electrode and the lower electrode, wherein the light-emitting layer contains a host, a first dopant and a second dopant, the luminescent color of the first dopant and the luminescent color of the second dopant are different, the first dopant is a blue-light-emitting dopant or a green-light-emitting dopant, the first dopant has a first functional group, and the first functional group makes the first dopant transfer toward the surface of the light-emitting layer on the upper electrode side in the light-emitting layer.

(2) The organic light-emitting device of the above (1), wherein the first functional group is at least one species selected from the group consisting of fluoroalkyl, perfluoroalkyl, alkyl (of 10 carbon atoms or more), perfluoropolyether and siloxy groups.

(3) The organic light-emitting device of the above (2), wherein the first dopant is of the iridium complex represented by Formula 1

[Formula 1]

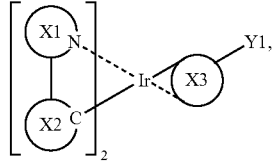

(Formula 1)

wherein X1 is an N-containing aromatic hetero ring, X2 is an aromatic hydrocarbon ring or aromatic hetero ring and X3 is acetylacetonate derivative, picolinate derivative or tetrakispyrazolyl borate derivative. Y1 is the first functional group.

(4) The organic light-emitting device of the above (1), wherein the second dopant has a second functional group, and the second functional group makes the second dopant transfer toward the surface of the light-emitting layer on the lower electrode side.

(5) The organic light-emitting device of the above (4), wherein the second functional group is at least one species selected from the group consisting of —OH, —SH, —COOH, —SO$_3$H, I, Br, Cl, F, SCN, CN, NH$_2$, NO$_2$ and bipyridyl groups.

(6) The organic light-emitting device of the above (4), wherein a hole injection layer is disposed between the lower electrode and the light-emitting layer, and the second functional group is at least one species selected from the group consisting of phenylamino, oxazole, carbazole group, and hydrazone site.

(7) The organic light-emitting device of the above (1), wherein the light-emitting layer contains a third dopant, and the luminescent color of the third dopant is different from the luminescent color of the first dopant and the luminescent color of the second dopant.

(8) The organic light-emitting device of the above (1), wherein the absolute value of the lowest unoccupied molecular orbital energy of the blue-light-emitting dopant is higher than that of the green-light-emitting dopant when the second dopant is a blue-light-emitting dopant or a green-light-emitting dopant.

(9) The organic light-emitting device of the above (1), wherein the peak position of the first dopant's concentration is on the upper electrode side in the center of the light-emitting layer in the thickness direction of the light-emitting layer, and the first dopant's concentration monotonically decreases from the peak position of the first dopant's concentration toward the lower electrode side in the thickness direction of the light-emitting layer.

(10) The organic light-emitting device of the above (4), wherein the peak position of the second dopant's concentration is on the lower electrode side in the center of the light-emitting layer in the thickness direction of the light-emitting layer, and the second dopant's concentration monotonically decreases from the peak position of the second dopant's concentration toward the upper electrode side in the thickness direction of the light-emitting layer.

(11) A coating solution used for forming the light-emitting layer for the organic light-emitting device of the above (1), containing a solvent, the host, the first dopant and the second dopant.

(12) A luminescent material used for forming the light-emitting layer for the organic light-emitting device of the above (1), containing the host, the first dopant and the second dopant.

(13) A light source device using the organic light-emitting device of the above (1).

(14) A method of organic light-emitting device comprising a upper electrode, a lower electrode, and a light-emitting layer positioned between the upper electrode and the lower electrode, wherein the light-emitting layer contains a host material, a first dopant and a second dopant, the luminescent color of the first dopant and the luminescent color of the second dopant are different, the first dopant is a blue-light-emitting dopant or a green-light-emitting dopant, the first dopant has a first functional group, the first functional group makes the first dopant transfer toward the surface of the light-emitting layer on the upper electrode side, and the light-emitting layer is prepared by a coating method.

(15) The method of organic light-emitting device of the above (14), wherein the light-emitting layer contains a third dopant, the luminescent color of the third dopant is different from the luminescent color of the first dopant and the luminescent color of the second dopant, the first dopant, the second dopant and the third dopant are a red-light-emitting dopant, a green-light-emitting dopant or a blue-light-emitting dopant each other, the solid concentration of the red-light-emitting dopant is less than 10 wt %, the solid concentration of the green-light-emitting dopant is less than 10 wt %, and the solid concentration of the blue-light-emitting dopant is 10 wt % or more and 30 wt % or less.

The present invention also provides an organic luminescent material, coating solution using the organic luminescent material for organic light-emitting layers, organic light-emitting device using the coating solution, light source device using the organic light-emitting device and method of the organic light-emitting device, easily controlling the concentration of dopants. Other problems, configurations, and effects will be apparent from the following detailed description of the invention.

BRIEF DESCRIPTION OF THE DRAWINGS

FIG. 9 is a concentration distribution of each dopant in a mixed film in the thickness direction of the mixed film of the present invention.

DETAILED DESCRIPTION OF THE PREFERRED EMBODIMENTS

The present invention is described in detail by referring to the attached drawings and the like. It should be noted, however, that the following embodiments are illustrated only by way of example of the present invention and are never construed to limit the scope of the present invention; and it is apparent to those skilled in the art that various changes and modifications may be made without departing from the spirit and scope of the present invention as set forth herein and in the appended claims.

The conventional coating method for producing an organic light-emitting device involves a disadvantage of difficulty in controlling dopant concentrations because of their very low concentrations, about 0.02 mol % with a green-light-emitting dopant, 0.02 mol % and 0.015 mol % with a red-light-emitting dopant in order to suppress the energy transfer from blue-light-emitting dopant. Moreover, the device cannot exhibit a sufficient light-emitting efficiency, because of insufficient energy transfer between the dopants and insufficient containment of the carrier in the light-emitting region.

Figure 1:
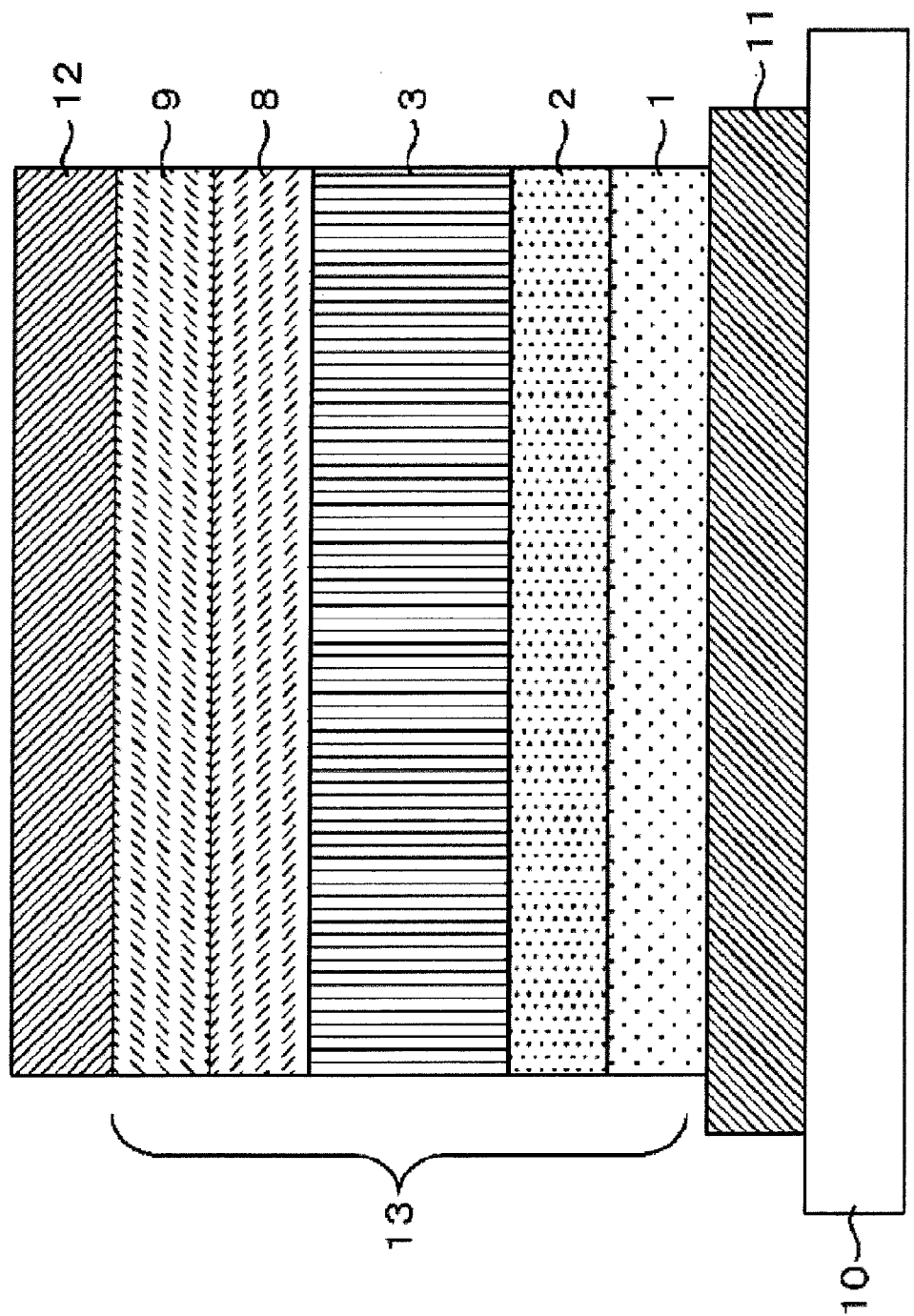
FIG. 1 is a cross-sectional view of one embodiment of the organic light-emitting device of the present invention.

FIG. 1 is a cross-sectional view of one embodiment of the organic light-emitting device of the present invention. The organic light-emitting device includes an upper electrode 12, a lower electrode 11 and an organic layer 13. The lower electrode 11, the organic layer 13 and the upper electrode 12 are positioned in this order from a substrate 10 in FIG. 1 and the organic light-emitting device in FIG. 1 is of bottom emission type in which light emitted by a light-emitting layer 3 is taken out from the lower electrode 11 side. The lower electrode 11 is the transparent electrode working as the anode and the upper electrode 12 is the repeller working as the cathode. The organic light-emitting device may be of top emission type in which the upper electrode 12 is the transparent electrode when the upper electrode 12 is working as the cathode and the lower electrode 11 is working as the anode.

The substrate 10 and the lower electrode 11, the lower electrode 11 and the organic layer 13, and the organic layer 13 and the upper electrode 12, may contact with each other and another layer may be between each layers. Examples of another layer may include inorganic buffer layer or injection layer. Examples of the material of buffer layer may include vanadium oxide, molybdenum oxide and tungsten oxide.

The organic layer 13 may be of a single-layer structure with the light-emitting layer 3 alone or multi-layer structure with one or more other layers selected from the group consisting of electron injection layer 9, electron transport layer 8, hole transport layer 2 and hole injection layer 1. The electron injection layer 9 and the electron transport layer 8, electron transport layer 8 and the light-emitting layer 3, the light-emitting layer 3 and the hole transport layer 2, and hole transport layer 2 and hole injection layer 1, may contact with each other and another layer may be between each layers.

The organic light-emitting layer illustrated in FIG. 1 makes a light source device, when provided with a driving circuit, a case and so on.

Figure 8:
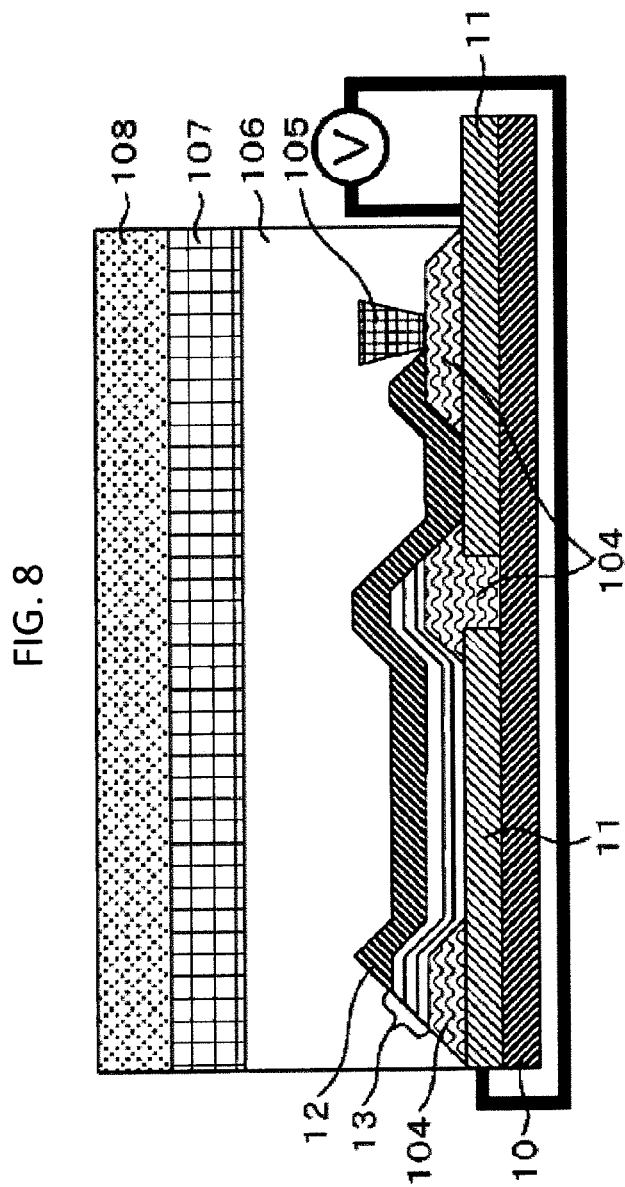
FIG. 8 is a cross-sectional view of one embodiment of the light source device of the present invention.

FIG. 8 is a cross-sectional view of one embodiment of the light source device of the present invention. The organic light-emitting device in FIG. 8 is of top emission type in which the light is taken out from the upper electrode 12 side. In FIG. 8, the lower electrode 11, a first bank 104, a second bank 105, the organic layer 13, the upper electrode 12, a resin layer 106, a seal substrate 107 and a light extracting layer 108 are positioned in this order from a substrate 10. When the organic light-emitting device is of bottom emission type, the light extracting layer 108 is disposed on the side which the organic layer 13 does not exist against the substrate 10.

The first bank 104 is formed in a forward tapered shape and the first bank 104 plays a role to cover the edge of the lower electrode 11 which is patterned. The second bank 105 is formed in a reverse tapered shape and the second bank 105 plays a role to separate the organic layers 13 and the upper electrodes 12 in adjacent elements.

Examples of materials of the first bank 104 and the second bank 105 may include polyimide resin, acrylic resin, novolac resin and phenol resin. The first bank 104 and the second bank 105 are formed by exposure and development method by using the designated photomask after the organic layer 13 is produced by coating method.

Water repellent finishing may be treated to the surfaces of the first bank 104 and the second bank 105 based on the following process. For example, the surfaces of the first bank 104 and the second bank 105 are subjected to the plasma treatment of fluorine-containing gases and the surfaces of the first bank 104 and the second bank 105 are fluorinated.

The resin layer 106 and the seal substrate 107 play a role to prevent from entering of gases and water which are the cause of the organic light-emitting device deterioration.

The light extracting layer 108 plays a role to effectively extract the light emitted in the light-emitting layer 3.

The light-emitting layer 3 contains a host 4 and a dopant.

The light-emitting layer 3 is a layer in which electrons and holes, injected from the upper electrodes 12, the lower electrodes 11, the electron transport layer 8 or the hole transport layer 9, recombine to cause light-emitting. The site of causing light-emitting is inside the light-emitting layer 3, or at the interface between the light-emitting layer 3 and the adjacent layer.

Fluorescent compounds or phosphorescent compounds can be in use as a dopant. The dopant contains a red-light-emitting dopant 5, a green-light-emitting 6 and a blue-light-emitting dopant 7.

A material for forming the light-emitting layer 3 contains the host 4, the red-light-emitting dopant 5, the green-light-emitting 6 and the blue-light-emitting dopant 7. A material for forming the light-emitting layer 3 may contain the host 4, the red-light-emitting dopant 5 and the blue-light-emitting dopant 7. A material for forming the light-emitting layer 3 may contain the host 4, the red-light-emitting dopant 5 and the green-light-emitting 6. A material for forming the light-emitting layer 3 may contain the host 4, the green-light-emitting 6 and the blue-light-emitting dopant 7.

The luminescent color of the red-light-emitting dopant 5, the luminescent color of the green-light-emitting 6 and the luminescent color of the blue-light-emitting dopant 7 are different from each other. "The luminescent colors are different" means that the dopant's wavelengths of three colors which indicate maximum strength in PL spectrum are different from each other.

Each of the dopants is localized in the light-emitting layer 3 to form a pseudo laminated structure.

<Phase Separation>

The methods for producing organic light-emitting devices broadly fall into two categories, vacuum vapor deposition and coating. The coating method has advantages of easily producing large-area films and high material utilization factor. In order to apply the coating method, development of devices with a single light-emitting layer is demanded, because it is necessary to reduce the number of organic light-emitting layers.

When the red-light-emitting dopant 5, the green-light-emitting dopant 6 and the blue-light-emitting dopant 7 are mixed with each other to form a single white-light-emitting layer, one species of the dopant is surrounded by one or two species of the dissimilar dopants, with the result that excitation energy is transferred from the dopant to the adjacent dissimilar dopant at a certain probability. For example, when the blue-light-emitting dopant 7 is present adjacently to the green-light-emitting dopant 6 or the red-light-emitting dopant 5, excitation energy is transferred from the blue-light-emitting dopant 7 to the dopant of lower energy, the green-light-emitting dopant 6 or the red-light-emitting dopant 5, making it difficult for the single layer to emit white light.

The transfer of excitation energy can occur when three color's dopants are included in the single light-emitting layer and when two color's dopants are included in the single light-emitting layer. For example, when the green-light-emitting dopant 6 and the red-light-emitting dopant 5 are present in the single light-emitting layer, excitation energy is transferred from the green-light-emitting dopant 6 to the dopant of lower energy, the red-light-emitting dopant 5, making it difficult for the single layer to emit white light.

Therefore, the coating method should produce a device efficiently emitting white light even when each of the dopants is present at a high concentration, if it could realize spontaneous phase-separation between the dissimilar dopants to separate dopants of lower energy from each other. One embodiment in the preset invention realizes the spontaneous phase-separation by incorporating each of the dopants with an adequate functional group.

Highest occupied molecular orbital (HOMO) energy and lowest unoccupied molecular orbital (LUMO) of the host 4, the red-light-emitting dopant 5, the green-light-emitting dopant 6 and the blue-light-emitting dopant 7 In FIG. 2 to FIG. 7 are as below.

The HOMO energy is determined by photoluminescence spectra. The LUMO energy may be determined by finding the HOMO-LUNO differential energy from the absorption spectra or directly by inverse photoemission spectroscopy.

The green-light-emitting dopant 6, the host 4, the blue-light-emitting dopant 7 and the red-light-emitting dopant 5 are arranged in ascending order of the LUMO. The red-light-emitting dopant 5, the green-light-emitting dopant 6, the blue-light-emitting dopant 7 and the host 4 are arranged in ascending order of the HOMO. The HOMO and the LUMO of each molecule are not limited to the above order.

<Layer Composition of the Red-Light-Emitting Dopant and the Green-Light-Emitting Dopant>

Figure 2:
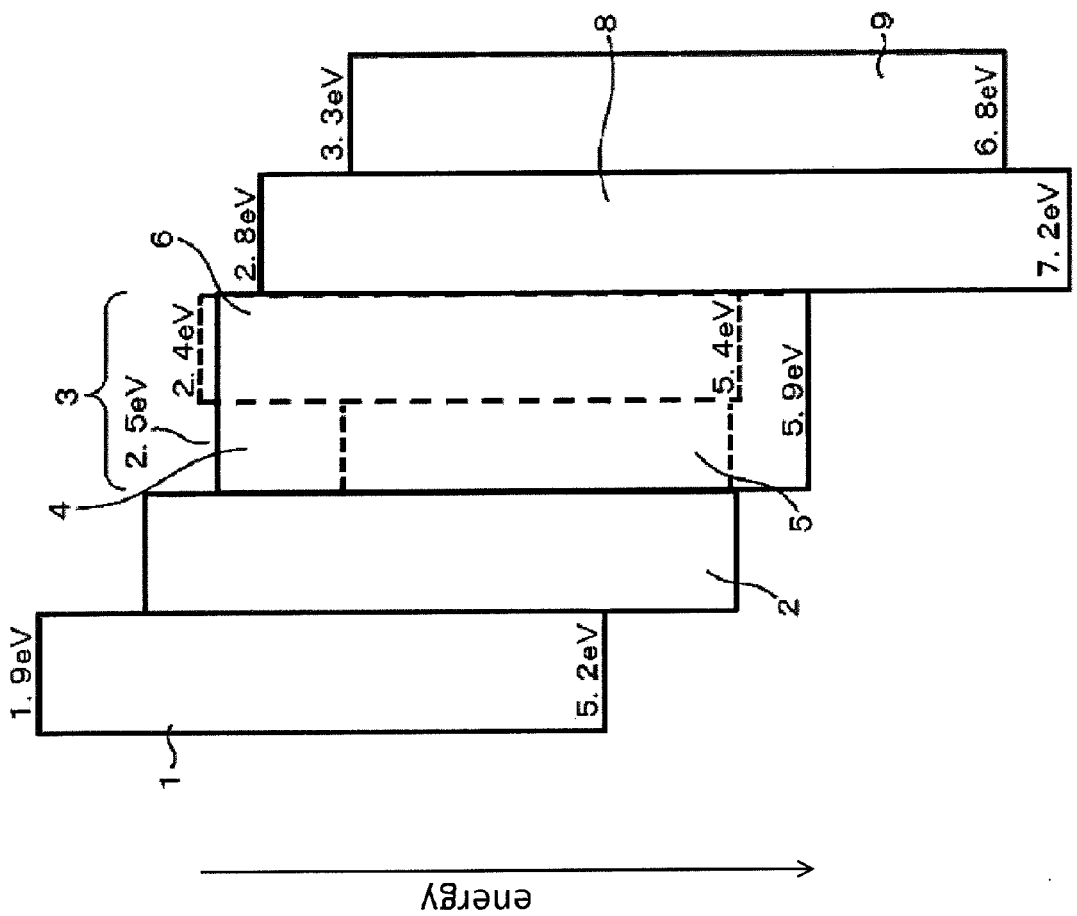
FIG. 2 is an energy diagram of each component in the organic light-emitting device.

Let's consider that the phase-separation spontaneously occurs in each of the red-light-emitting dopant 5 and the green-light-emitting dopant 6 to form the pseudo laminated structure, illustrated in FIG. 2. The white light can be obtained by adjusting the maximum strength in PL spectrum of the red-light-emitting dopant 5 and the green-light-emitting dopant 6.

The host 4, the red-light-emitting dopant 5 and the green-light-emitting dopant 6 are included in the light-emitting layer 3.

The green-light-emitting dopant 6 has a functional group which makes the green-light-emitting dopant 6 transfer toward the surface of the light-emitting layer 3 on the electron transport layer 8 (the upper electrode 12) side.

The red-light-emitting dopant 5 has a functional group which makes the red-light-emitting dopant 5 transfer toward the surface of the light-emitting layer 3 on the hole transport layer 2 (the lower electrode 11) side. When the concentration of the red-light-emitting dopant 5 is sufficiently low, the red-light-emitting dopant 5 may not have a functional group which makes the red-light-emitting dopant 5 transfer toward the surface of the light-emitting layer 3 on the hole transport layer 2 (the lower electrode 11) side. It facilitates the control of dopant concentrations that the red-light-emitting dopant 5 has a functional group which makes the red-light-emitting dopant 5 transfer toward the surface of the light-emitting layer 3 on the hole transport layer 2 (the lower electrode 11) side.

Also, let's consider that the HOMO and the LUMO of, the red-light-emitting dopant 5 and the green-light-emitting dopant 6 are prescribed as illustrated in FIG. 2.

The concentration of the red-light-emitting dopant 5 is low to the extent that the hopping over the level of the dopants is reduced. Because of this, the electron mobility and the hole mobility in the red-light-emitting dopant 5 region are lower than those in the green-light-emitting dopant 6 region.

The electrons injected from the electron transport layer 8 to the light-emitting layer 3 hop over the LUMO level of the host 4 and propagate in the light-emitting layer 3. The electrons are accumulated in the proximity of a boundary between the red-light-emitting dopant 5 region and the green-light-emitting dopant 6 region because the electron mobility in the red-light-emitting dopant 5 region is lower than that in the green-light-emitting dopant 6 region.

On the other hand, the holes are injected from the hole transport layer 2 to the HOMO level of the host 4, the holes hop over the HOMO level of the host 4, and the holes propagate in the light-emitting layer 3.

The holes propagated from the red-light-emitting dopant 5 region enter into the HOMO level of the green-light-emitting dopant 6 and green light is emitted by the recombination of the electrons and the holes. The movement of the exciton generated by the recombination to the red-light-emitting dopant 5 region by diffusion results in emitting red light. The recombination of the electrons which propagated to the red-light-emitting dopant 5 region and the holes in the red-light-emitting dopant 5 region results in emitting red light.

As stated above, it is easy to control the concentration of dopants. Also, high efficient organic light-emitting device can be obtained by the containment of the carrier in the dopant region which has the highest T1 energy and the recombination of the carrier.

<Layer Composition of the Red-Light-Emitting Dopant and the Blue-Light-Emitting Dopant>

Figure 3:
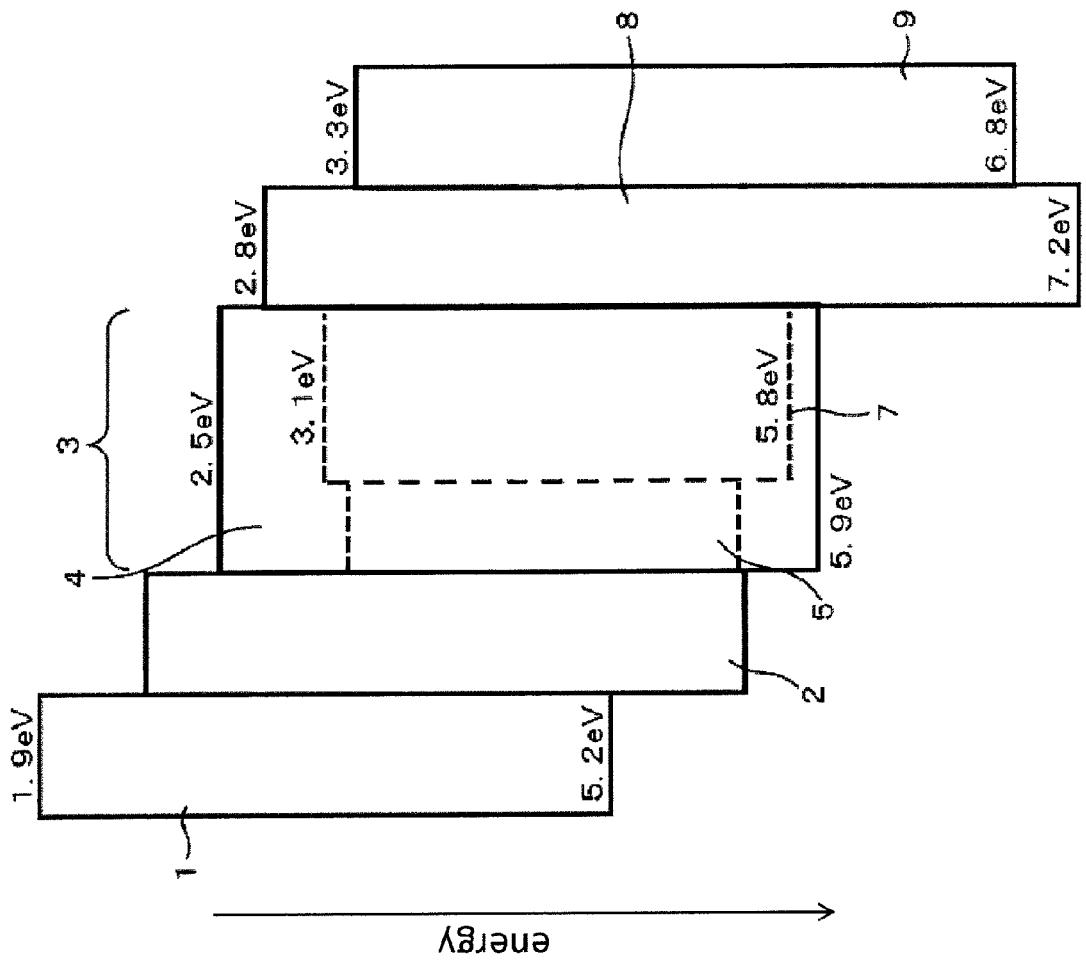
FIG. 3 is an energy diagram of each component in the organic light-emitting device.

Let's consider that the phase-separation spontaneously occurs in each of the red-light-emitting dopant 5 and the blue-light-emitting dopant 7 to form the pseudo laminated structure, illustrated in FIG. 3. The white light can be obtained by adjusting the maximum strength in PL spectrum of the red-light-emitting dopant 5 and the blue-light-emitting dopant 7.

The host 4, the red-light-emitting dopant 5 and the blue-light-emitting dopant 7 are included in the light-emitting layer 3.

The blue-light-emitting dopant 7 has a functional group which makes the blue-light-emitting dopant 7 transfer toward the surface of the light-emitting layer 3 on the electron transport layer 8 (the upper electrode 12) side.

The red-light-emitting dopant 5 has a functional group which makes the red-light-emitting dopant 5 transfer toward the surface of the light-emitting layer 3 on the hole transport layer 2 (the lower electrode 11) side. The red-light-emitting dopant 5 may not have a functional group which makes the red-light-emitting dopant 5 transfer toward the surface of the light-emitting layer 3 on the hole transport layer 2 (the lower electrode 11) side. It facilitates control of dopant concentrations that the red-light-emitting dopant 5 has a functional group which makes the red-light-emitting dopant 5 transfer toward the surface of the light-emitting layer 3 on the hole transport layer 2 (the lower electrode 11) side.

Also, let's consider that the HOMO and the LUMO of the red-light-emitting dopant 5 and the blue-light-emitting dopant 7 are prescribed as illustrated in FIG. 3.

The concentration of the red-light-emitting dopant 5 is low to the extent that the hopping over the level of the dopants reduces. Because of this, the electron mobility and the hole mobility in the red-light-emitting dopant 5 region are lower than those in the blue-light-emitting dopant 7 region.

When the blue-light-emitting dopant 7 which has the proper concentration (for example, the concentration to the host 4 is not less than 10 wt %) is included on the electron transport layer 8 side in the light-emitting layer 3, the electrons injected from the electron transport layer 8 to the light-emitting layer 3 hop over the LUMO level of the blue-light-emitting dopant 7 and propagate in the light-emitting layer 3. The electrons are accumulated in the proximity of a boundary between the red-light-emitting dopant 5 region and the blue-light-emitting dopant 7 region because the electron mobility in the red-light-emitting dopant 5 region is lower than that in the blue-light-emitting dopant 7 region.

On the other hand, the holes are injected from the hole transport layer 2 to the HOMO level of the host 4, the holes hop over the HOMO level of the host 4, and the holes propagate in the light-emitting layer 3.

The holes propagated from the red-light-emitting dopant 5 region enter into the HOMO level of the blue-light-emitting dopant 7 and blue light is emitted by the recombination of the electrons and the holes. The movement of the exciton generated by the recombination to the red-light-emitting dopant 5 region by diffusion results in emitting red light. The recombination of the electrons which propagated to the red-light-emitting dopant 5 region and the holes in the red-light-emitting dopant 5 region results in emitting red light.

As stated above, it is easy to control the concentration of dopants. Also, the light-emitting efficiency of each color is raised and the light-emitting efficiency of the light-emitting device can be increased. Also, white light which has satisfactory chromaticity can be obtained by simple configuration.

<Layer Composition of the Green-Light-Emitting Dopant and the Blue-Light-Emitting Dopant 1>

Figure 4:
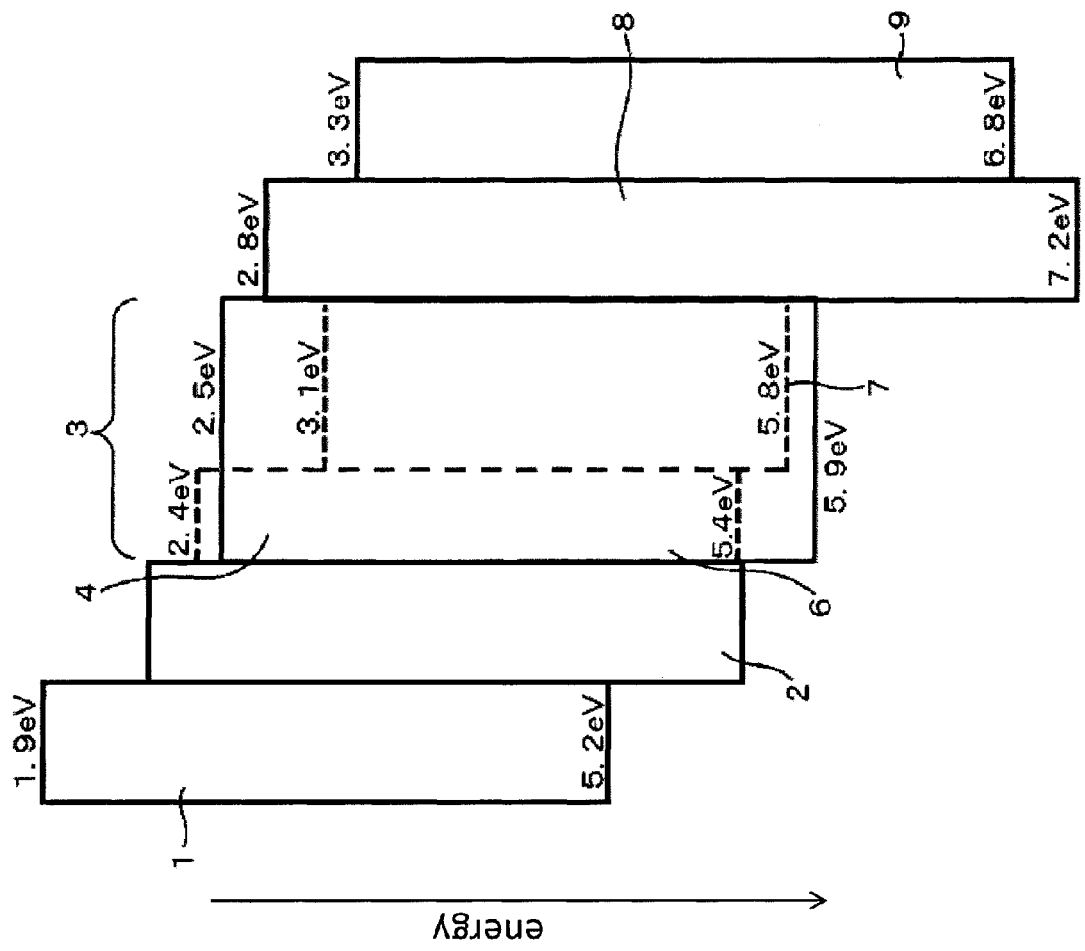
FIG. 4 is an energy diagram of each component in the organic light-emitting device.

Let's consider that the phase-separation spontaneously occurs in each of the green-light-emitting dopant 6 and the blue-light-emitting dopant 7 to form the pseudo laminated structure, illustrated in FIG. 4. The white light can be obtained by adjusting the maximum strength in PL spectrum of the green-light-emitting dopant 6 and the blue-light-emitting dopant 7.

The host 4, the green-light-emitting dopant 6 and the blue-light-emitting dopant 7 are included in the light-emitting layer 3.

The blue-light-emitting dopant 7 has a functional group which makes the blue-light-emitting dopant 7 transfer toward the surface of the light-emitting layer 3 on the electron transport layer 8 (the upper electrode 12) side.

The green-light-emitting dopant 6 has a functional group which makes the green-light-emitting dopant 6 transfer toward the surface of the light-emitting layer 3 on the hole transport layer 2 (the lower electrode 11) side. The green-light-emitting dopant 6 may not have a functional group which makes the green-light-emitting dopant 6 transfer toward the surface of the light-emitting layer 3 on the hole transport layer 2 (the lower electrode 11) side. It preferably facilitates control of dopant concentrations that the green-light-emitting dopant 6 has a functional group which makes the green-light-emitting dopant 6 transfer toward the surface of the light-emitting layer 3 on the hole transport layer 2 (the lower electrode 11) side.

Also, let's consider that the HOMO and the LUMO of the green-light-emitting dopant 6 and the blue-light-emitting dopant 7 are prescribed as illustrated in FIG. 4.

When the blue-light-emitting dopant 7 which has the proper concentration (for example, the concentration to the host 4 is not less than 10 wt %) is included on the electron transport layer 8 side in the light-emitting layer 3, the electrons injected from the electron transport layer 8 to the light-emitting layer 3 hop over the LUMO level of the blue-light-emitting dopant 7 and propagate in the light-emitting layer 3. The green-light-emitting dopant 6 is an obstacle to the electrons because the absolute value of the LUMO energy of the green-light-emitting dopant 6 is lower than that of the blue-light-emitting dopant 7. Herewith, the electrons can be contained in the blue-light-emitting dopant 7 region.

On the other hand, the holes are injected from the hole transport layer 2 to the HOMO level of the host 4, the holes hop over the HOMO level of the host 4, and the holes propagate in the light-emitting layer 3.

The holes propagated from the green-light-emitting dopant 6 region enter into the HOMO level of the blue-light-emitting dopant 7 and blue light is emitted by the recombination of the electrons and the holes. The movement of the exciton generated by the recombination to the green-light-emitting dopant 6 region by diffusion results in emitting green light. The recombination of the electrons which propagated to the green-light-emitting dopant 6 region and the holes in the green-light-emitting dopant 6 region results in emitting green light.

As stated above, it is easy to control the concentration of dopants. Also, the light-emitting efficiency of each color is raised and the light-emitting efficiency of the light-emitting device can be increased. Also, the concentration of the green-light-emitting dopant 6 and the blue-light-emitting dopant 7 included in the light-emitting layer 3 can be raised.

<Layer Composition of the Green-Light-Emitting Dopant and the Blue-Light-Emitting Dopant 2>

Figure 5:
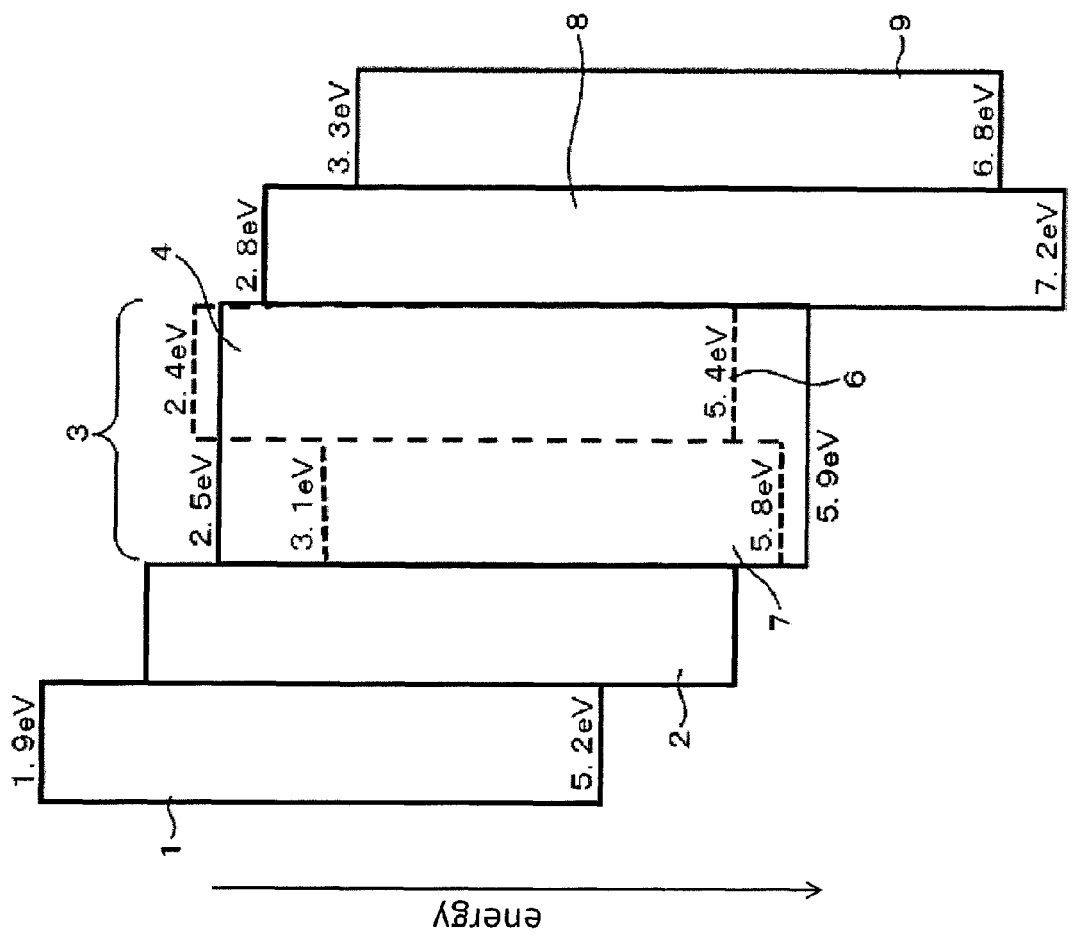
FIG. 5 is an energy diagram of each component in the organic light-emitting device.

Let's consider that the phase-separation spontaneously occurs in each of the green-light-emitting dopant 6 and the blue-light-emitting dopant 7 to form the pseudo laminated structure, illustrated in FIG. 5. The white light can be obtained by adjusting the maximum strength in PL spectrum of the green-light-emitting dopant 6 and the blue-light-emitting dopant 7.

The host 4, the green-light-emitting dopant 6 and the blue-light-emitting dopant 7 are included in the light-emitting layer 3.

The green-light-emitting dopant 6 has a functional group which makes the green-light-emitting dopant 6 transfer toward the surface of the light-emitting layer 3 on the electron transport layer 8 (the upper electrode 12) side.

The blue-light-emitting dopant 7 has a functional group which makes the blue-light-emitting dopant 7 transfer toward the surface of the light-emitting layer 3 on the hole transport layer 2 (the lower electrode 11) side. The blue-light-emitting dopant 7 may not have a functional group which makes the blue-light-emitting dopant 7 transfer toward the surface of the light-emitting layer 3 on the hole transport layer 2 (the lower electrode 11) side. It facilitates control of dopant concentrations that the blue-light-emitting dopant 7 has a functional group which makes the blue-light-emitting dopant 7 transfer toward the surface of the light-emitting layer 3 on the hole transport layer 2 (the lower electrode 11) side.

Let's consider that the HOMO and the LUMO of the green-light-emitting dopant 6 and the blue-light-emitting dopant 7 are prescribed as illustrated in FIG. 5.

When the absolute value of the LUMO energy of the green-light-emitting dopant 6 is lower than that of the host 4, the trap capacity to the electrons falls. The electrons injected from the electron transport layer 8 to the light-emitting layer 3 hop over the LUMO level of the host 4 and propagate in the light-emitting layer 3. The electrons hop over the LUMO level of blue-light-emitting dopant 7 in the blue-light-emitting dopant 7 region.

On the other hand, the holes are injected from the hole transport layer 2 to the HOMO level of the blue-light-emitting dopant 7, and the holes hop over the HOMO level of the blue-light-emitting dopant 7. The holes are contained in the blue-light-emitting dopant 7 region because the hole mobility of the green-light-emitting dopant 6 is lower than that of the blue-light-emitting dopant 7. Herewith, the recombination occurs in the blue-light-emitting dopant 7 and blue light is emitted.

It results in emitting green light that the exciton generated by the recombination in the blue-light-emitting dopant 7 region is buffered in the green-light-emitting dopant 6 region, or the holes which are not contained in the blue-light-emitting dopant 7 region propagate to the green-light-emitting dopant 6 region and recombine with the electrons there.

As stated above, it is easy to control the concentration of dopants. Also, the light-emitting efficiency of each color is raised and the light-emitting efficiency of the light-emitting device can be increased.

<Layer Composition of the Red-Light-Emitting Dopant, Green-Light-Emitting Dopant and the Blue-Light-Emitting Dopant 1>

Figure 6:
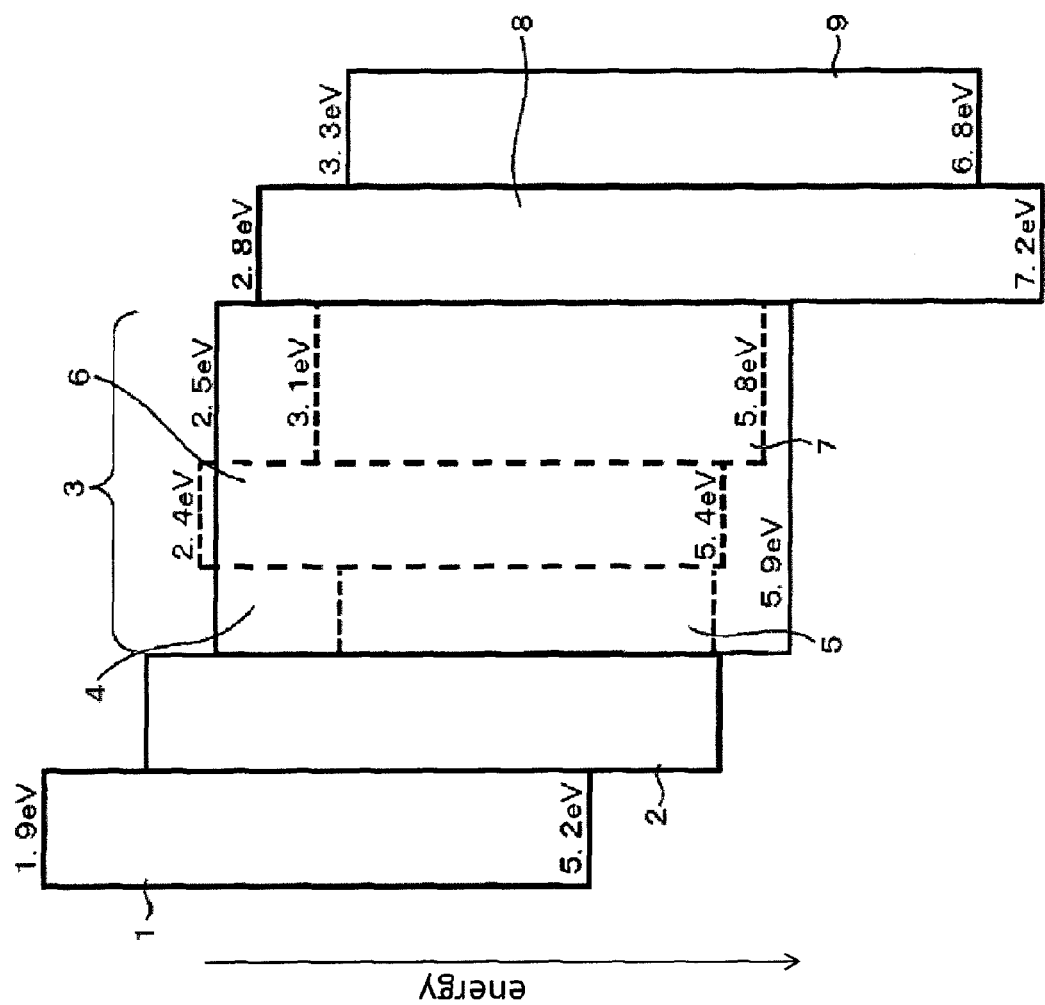
FIG. 6 is an energy diagram of each component in the organic light-emitting device.

Let's consider that the phase-separation spontaneously occurs in each of the red-light-emitting dopant 5, the green-light-emitting dopant 6 and the blue-light-emitting dopant 7 to form the pseudo laminated structure, illustrated in FIG. 6.

The host 4, the red-light-emitting dopant 5, the green-light-emitting dopant 6 and the blue-light-emitting dopant 7 are included in the light-emitting layer 3.

The blue-light-emitting dopant 7 has a functional group which makes the blue-light-emitting dopant 7 transfer toward the surface of the light-emitting layer 3 on the electron transport layer 8 (the upper electrode 12) side.

The red-light-emitting dopant 5 has a functional group which makes the red-light-emitting dopant 5 transfer toward the surface of the light-emitting layer 3 on the hole transport layer 2 (the lower electrode 11) side. The red-light-emitting dopant 5 may not have a functional group which makes the red-light-emitting dopant 5 transfer toward the surface of the light-emitting layer 3 on the hole transport layer 2 (the lower electrode 11) side. It facilitates control of dopant concentrations that the red-light-emitting dopant 5 has a functional group which makes the red-light-emitting dopant 5 transfer toward the surface of light-emitting layer 3 on the hole transport layer 2 (the lower electrode 11) side.

FIG. 6 illustrates that the red-light-emitting dopant 5, green-light-emitting dopant 6 and blue-light-emitting dopant 7 are arranged in this order from the anode in consideration of the carrier conduction, determined by the highest occupied molecular orbital (HOMO) energy and lowest unoccupied molecular orbital (LUMO) energy of each of the dopants.

The concentration of the red-light-emitting dopant 5 and the green-light-emitting dopant 6 are low (no more than 10 wt %) to the extent that the hopping over the level of the dopants reduces. Because of this, the electron mobility and the hole mobility in the red-light-emitting dopant 5 region and in the green-light-emitting dopant 6 region are lower than those in the blue-light-emitting dopant 7 region.

When the blue-light-emitting dopant 7 which has the proper concentration (for example, the concentration to the host 4 is not less than 10 wt %) is included on the electron transport layer 8 side in the light-emitting layer 3, the electrons injected from the electron transport layer 8 to the light-emitting layer 3 hop over the LUMO level of the blue-light-emitting dopant 7 and propagate in the light-emitting layer 3. The electrons are accumulated in the proximity of a boundary between the green-light-emitting dopant 6 region and the blue-light-emitting dopant 7 region because the electron mobility in the green-light-emitting dopant 6 region is lower than that in the blue-light-emitting dopant 7 region. Furthermore, the green-light-emitting dopant 6 is an obstacle to the electrons because the absolute value of the LUMO energy of the green-light-emitting dopant 6 is lower than that of the blue-light-emitting dopant 7. Because of this, the electrons can be contained in the blue-light-emitting dopant 7 region.

On the other hand, the holes are injected from the hole transport layer 2 to the HOMO level of the host 4, the holes hop over the HOMO level of the host 4, and the holes propagate in the light-emitting layer 3.

The holes propagated from the green-light-emitting dopant 6 region enter into the HOMO level of the blue-light-emitting dopant 7 and blue light is emitted by the recombination of the electrons and the holes.

The movement of the exciton generated by the recombination to the green-light-emitting dopant 6 and the red-light-emitting dopant 5 region by diffusion results in emitting red light and green light. The recombination of the electrons which propagated to the green-light-emitting dopant 6 region and the holes in the green-light-emitting dopant 6 region results in emitting green light.

As stated above, it is easy to control the concentration of dopants. Also, the light-emitting efficiency of each color is raised and the light-emitting efficiency of the light-emitting device can be increased. Also, in addition to the difference of mobility, energy difference between the LUMO level of the blue-light-emitting dopant 7 and the LUMO level of the green-light-emitting dopant 6 can be used as means to contain the electrons in the blue-light-emitting dopant 7 region, therefore it is preferably easy to contain the electrons.

<Layer Composition of the Red-Light-Emitting Dopant, Green-Light-Emitting Dopant and the Blue-Light-Emitting Dopant 2>

Let's consider that the phase-separation spontaneously occurs in each of the red-light-emitting dopant 5, the green-light-emitting dopant 6 and the blue-light-emitting dopant 7 to form the pseudo laminated structure, illustrated in FIG. 6.

The host 4, the red-light-emitting dopant 5, the green-light-emitting dopant 6 and the blue-light-emitting dopant 7 are included in the light-emitting layer 3.

The green-light-emitting dopant 6 has a functional group which makes the green-light-emitting dopant 6 transfer toward the surface of the light-emitting layer 3 on the electron transport layer 8 (the upper electrode 12) side.

The red-light-emitting dopant 5 has a functional group which makes the red-light-emitting dopant 5 transfer toward the surface of the light-emitting layer 3 on the hole transport layer 2 (the lower electrode 11) side. The red-light-emitting dopant 5 may not have a functional group which makes the red-light-emitting dopant 5 transfer toward the surface of the light-emitting layer 3 on the hole transport layer 2 (the lower electrode 11) side. It facilitates control of dopant concentrations that the red-light-emitting dopant 5 has a functional group which makes the red-light-emitting dopant 5 transfer toward the surface of the light-emitting layer 3 on the hole transport layer 2 (the lower electrode 11) side.

Figure 7:
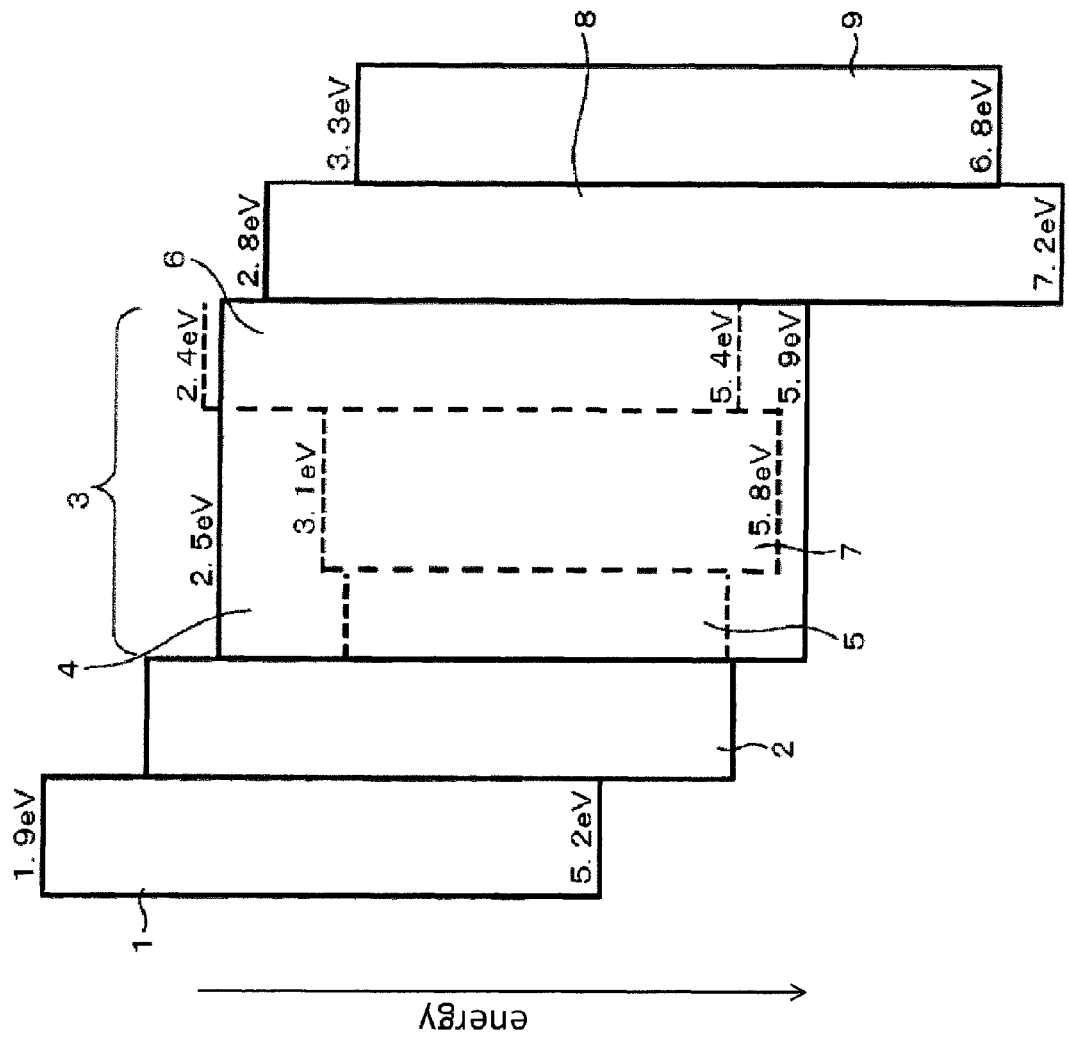
FIG. 7 is an energy diagram of each component in the organic light-emitting device.

FIG. 7 illustrates that the red-light-emitting dopant 5, blue-light-emitting dopant 7 and green-light-emitting dopant 6 are arranged in this order from the anode in consideration of the carrier conduction, determined by the highest occupied molecular orbital (HOMO) energy and lowest unoccupied molecular orbital (LUMO) energy of each of the dopants.

When the absolute value of the LUMO energy of the green-light-emitting dopant 6 is lower than that of the host 4, the trap capacity to the electrons falls. The electrons injected from the electron transport layer 8 to the light-emitting layer 3 hop over the LUMO level of the host 4 and propagate in the light-emitting layer 3. The electrons hop over the LUMO level of blue-light-emitting dopant 7 in the blue-light-emitting dopant 7 region. The electrons are contained in the blue-light-emitting dopant 7 region because the electron mobility of the red-light-emitting dopant 5 is lower than that of the blue-light-emitting dopant 7.

On the other hand, the holes are injected from the hole transport layer 2 to the HOMO level of the host 4, the holes hop over the HOMO level of the host 4, and the holes propagate in the light-emitting layer 3. The holes propagated from the red-light-emitting dopant 5 region hop over the HOMO level of the blue-light-emitting dopant 7 in the blue-light-emitting dopant 7 region. The holes are contained in the blue-light-emitting dopant 7 region because the hole mobility of the green-light-emitting dopant 6 is lower than that of the blue-light-emitting dopant 7. Herewith, the recombination occurs in the blue-light-emitting dopant 7 and blue light is emitted.

It results in emitting green light that the exciton generated by the recombination in the blue-light-emitting dopant 7 region is buffered in the green-light-emitting dopant 6 region, or the holes which are not contained in the blue-light-emitting dopant 7 region propagate to the green-light-emitting dopant 6 region and recombine with the electrons there. Also, it results in emitting red light that the exciton generated in the blue-light-emitting dopant 7 region is buffered in the red-light-emitting dopant 5 region, or the holes which are not contained in the blue-light-emitting dopant 7 region propagate to the red-light-emitting dopant 5 region and recombine with the electrons there.

As stated above, it is easy to control the concentration of dopants. Also, the light-emitting efficiency of each color is raised and the light-emitting efficiency of the light-emitting device can be increase.

<Host>

Preferable examples of the host 4 include carbazole derivatives, fluorene derivatives and arylsilane derivatives. The host 4 preferably has an excitation energy sufficiently higher than that of the blue-light-emitting dopant 7 to efficiently emit light. Excitation energy is determined by photoluminescence spectra.

<Blue-Light-Emitting Dopant>

The blue-light-emitting dopant 7 has the maximum strength in PL spectrum at room temperature (25° C.) in wavelength of 400 nm to 500 nm. Examples of the major skeleton of the blue-light-emitting dopant include perylene, iridium complex (e.g., bis(3,5-difluoro-2-(2-pyridyl)phenyl-(2-carboxypyridyl) iridium (III), FIrpic) Among the above materials, the iridium complex represented by Formula 1 is more preferable viewed from light-emitting characteristics.

[Formula 2]

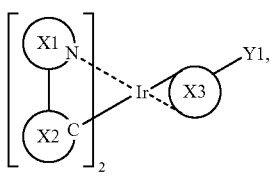

(Formula 1)

In formula 1, X1 is an N-containing aromatic hetero ring, X2 is an aromatic hydrocarbon ring or aromatic hetero ring.

Examples of aromatic hetero ring represented by X1 include quinoline ring, isoquinoline ring, pyridine ring, quinoxaline ring, thiazole ring, pyrimidine ring, benzothiazole ring, oxazole ring, benzoxazole ring, indole ring and isoindole ring.

Examples of aromatic hydrocarbon ring or aromatic hetero ring represented by X2 include benzene ring, naphthalene ring, anthracene ring, thiophene ring, benzothiophene ring, furan ring, benzofuran ring, fluorene ring.

In formula 1, examples of X3 include acetylacetonate derivative, picolinate derivative or tetrakispyrazolyl borate derivative. Also, X3 may be the same as X1-X2.

When the upper electrode 12 serves as the cathode and the lower electrode 11 serves as the anode, it is preferable that the blue-light-emitting dopant 7 exists on the upper side of the light-emitting layer 3 or in the center of the light-emitting layer 3.

When the blue-light-emitting dopant 7 exists on the upper side of the light-emitting layer 3, the blue-light-emitting dopant 7 has a functional group which makes the blue-light-emitting dopant 7 transfer toward the surface of the light-emitting layer 3 on the upper electrode 12 side. Herewith, the blue-light-emitting dopant 7 localizes on the upper electrode 12 side.

The peak position of the concentration of the blue-light-emitting dopant 7 is on the upper electrode 12 side in the center of the light-emitting layer 3 in the thickness direction of the light-emitting layer 3 by incorporating the blue-light-emitting dopant 7 with the first functional group. Also, the concentration of the blue-light-emitting dopant 7 monotonically decreases from the peak position of the concentration of the blue-light-emitting dopant 7 toward the lower electrode 11 side in the thickness direction of the light-emitting layer 3.

Examples of the first functional group Y1 incorporated with X3 to transfer the blue-light-emitting dopant 7 toward the film surface side (the upper electrode 12 side) during making the light-emitting layer include fluoroalkyl, perfluoroalkyl, alkyl (of 10 carbon atoms or more), perfluoropolyether and siloxy groups (—Si—O—Si—). The first functional group Y1 may be at least one species selected from the above group. The first functional group Y1 may be incorporated with X1 or X2. The first functional group Y1 may be incorporated with only one selected from the group consisting of X1, X2 and X3. The first functional group Y1 may be incorporated with one or more selected from the group consisting of X1, X2 and X3.

In view of surface energy, fluoroalkyl and perfluoroalkyl are preferable, and perfluoroalkyl are more preferable.

The blue-light-emitting dopant 7 may contain one or more of these functional groups.

In fluorine-based substituent, the more the substituent has fluorine, the more the blue-light-emitting dopant 7 localizes on the upper electrode side. Specifically, the number of fluorine in the substituent is preferably not less than 7.

The group may be introduced to the major skeleton directly, as illustrated by Formula 2, or indirectly via an amido or ester bond, as illustrated by Formula 3. The dopants which incorporate with the first functional group and the dopants which do not incorporate with the first functional group may be mixed in the blue-light-emitting dopant 7.

When the blue, light-emitting dopant 7 exists in the center of the light-emitting layer 3, the blue-light-emitting dopant 7 may not have the first functional group.

When the blue-light-emitting dopant 7 does not incorporate with the first functional group, the blue-light-emitting dopant 7 may be uniformity dispersed in the light-emitting layer 3. When the blue-light-emitting dopant 7 does not incorporate with the first functional group, the blue-light-emitting dopant 7 may include the following second functional group.

[Formula 3]

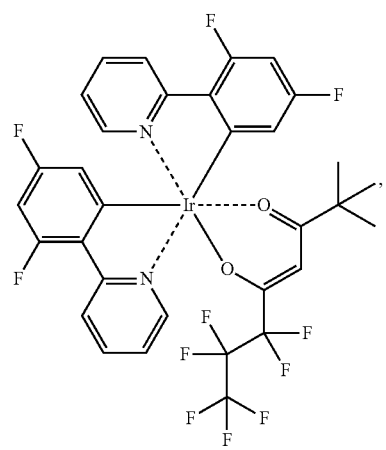

(Formula 2)

[Formula 4]

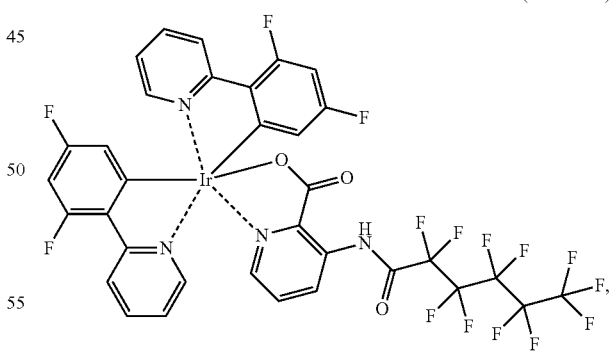

(Formula 3)

It is preferable that the solid concentration of the blue-light-emitting dopant 7 is 10 wt % or more and 30 wt % or less. It is preferable that the weight-average molecular weight of the blue-light-emitting dopant 7 is 500 or more and 3000 or less.

<Green-Light-Emitting Dopant>

The green-light-emitting dopant 6 has the maximum strength in PL spectrum at room temperature in wavelength of 500 nm to 590 nm.

Examples of preferable materials for the green-light-emitting dopant 6 include those having a major skeleton of coumarin, its derivative, iridium complex (e.g., tris(2-phenylpyridine) iridium, Ir(ppy)3). Among the above materials, the iridium complex represented by Formula 1 is more preferable viewed from light-emitting characteristics. In formula 1, X1 is an N-containing aromatic hetero ring, X2 is an aromatic hydrocarbon ring or aromatic hetero ring.

[Formula 5]

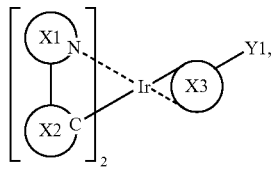

(Formula 1)

Examples of aromatic hetero ring represented by X1 include quinoline ring, isoquinoline ring, pyridine ring, quinoxaline ring, thiazole ring, pyrimidine ring, benzothiazole ring, oxazole ring, benzoxazole ring, indole ring and isoindole ring.

Examples of aromatic hydrocarbon ring or aromatic hetero ring represented by X2 include benzene ring, naphthalene ring, anthracene ring, thiophene ring, benzothiophene ring, furan ring, benzofuran ring, fluorene ring.

Examples of X3 include acetylacetonate or the same as X1-X2.

When the upper electrode 12 serves as the cathode and the lower electrode 11 serves as the anode, it is preferable that the green-light-emitting dopant 6 exists on the upper side of the light-emitting layer 3 or in the center of the light-emitting layer 3.

When the green-light-emitting dopant 6 exists on the upper side of the light-emitting layer 3, the green-light-emitting dopant 6 has the above first functional group Y1 which makes the green-light-emitting dopant 6 transfer toward the surface of the light-emitting layer 3 on the upper electrode 12 side. Herewith, the green-light-emitting dopant 6 localizes on the upper electrode side.

The peak position of the concentration of the green-light-emitting dopant 6 is on the upper electrode 12 side in the center of the light-emitting layer 3 in the thickness direction of the light-emitting layer 3 by incorporating the green-light-emitting dopant 6 with the above functional group. Also, the concentration of the green-light-emitting dopant 6 monotonically decreases from the peak position of the concentration of the green-light-emitting dopant 6 toward the lower electrode 11 side in the thickness direction of the light-emitting layer 3.

The group may be introduced to the major skeleton directly, as illustrated by Formula 4, or indirectly via an amido or ester bond, as illustrated by Formula 5.

When the green-light-emitting dopant 6 exists in the center of the light-emitting layer 3, the green-light-emitting dopant 6 may not have the first functional group.

The dopants which incorporate with the first functional group and the dopants which do not incorporate with the first functional group may be mixed in the green-light-emitting dopant 6. When the green-light-emitting dopant 6 does not incorporate with the first functional group, the blue-light-emitting dopant 7 may be uniformity dispersed in the light-emitting layer 3. When the green-light-emitting dopant 6 does not incorporate with the first functional group, the green-light-emitting dopant 6 may include the following second functional group.

[Formula 6]

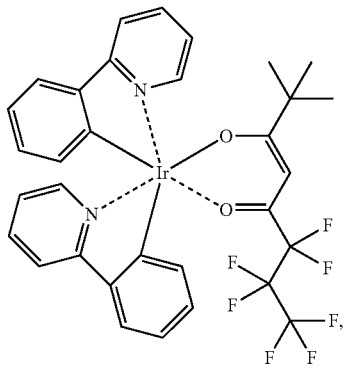

(Formula 4)

[Formula 7]

(Formula 5)

It is preferable that the solid concentration of the green-light-emitting dopant 6 is no more than 10 wt %. It is preferable that the weight-average molecular weight of the green-light-emitting dopant 6 is 500 or more and 3000 or less.

<Red-Light-Emitting Dopant>

The red-light-emitting dopant 5 has the maximum strength in PL spectrum at room temperature in wavelength of 590 nm to 780 nm.

Examples of preferable materials for the red-light-emitting dopant include those having a major skeleton of rubrene, (E)-2-(2-(4-dimethylamino) styryl)-6-methyl-4H-pyran-4-ylidene) malononitrile (DCM) its derivative, iridium complex (e.g., bis(1-phenylisoquinoline) (acetylacetonate) iridium (III)), osmium complex or europium complex. Among the above materials, the iridium complex represented by Formula 1 is more preferable viewed from light-emitting characteristics. In formula 1, X1 is an N-containing aromatic hetero ring, X2 is an aromatic hydrocarbon ring or aromatic hetero ring.

[Formula 8]

(Formula 1)

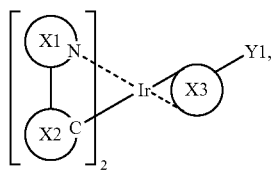

Examples of aromatic hetero ring represented by X1 include quinoline ring, isoquinoline ring, pyridine ring, quinoxaline ring, thiazole ring, pyrimidine ring, benzothiazole ring, oxazole ring, benzoxazole ring, indole ring and isoindole ring.

Examples of aromatic hydrocarbon ring or aromatic hetero ring represented by X2 include benzene ring, naphthalene ring, anthracene ring, thiophene ring, benzothiophene ring, furan ring, benzofuran ring, fluorene ring.

It is preferable examples of X3 include acetylacetonate derivative.

The red-light-emitting dopant 5 has a second functional group which makes the red-light-emitting dopant 5 transfer toward the surface of the light-emitting layer 3 on the hole transport layer 2 side. Herewith, the red-light-emitting dopant 5 localizes on the lower electrode side.

In this case, the peak position of the concentration of the red-light-emitting dopant 5 is on the lower electrode 11 side in the center of the light-emitting layer 3 in the thickness direction of the light-emitting layer 3. Also, the concentration of the red-light-emitting dopant 5 monotonically decreases from the peak position of the concentration of the red-light-emitting dopant 5 toward the upper electrode 12 side in the thickness direction of the light-emitting layer 3.

When the underlying layer of the light-emitting layer 3 is the hole transport layer 2, the second functional group has a structure similar to the structure in the hole transport layer 2. Examples of the second functional group include phenylamino, oxazole or carbazole group, or hydrazone site. The red-light-emitting dopant 5 may contain one or more of these functional groups.

When the underlying layer of the light-emitting layer 3 is the hole injection layer 1 (the hole injection layer 1 is disposed between the lower electrode 11 and the light-emitting layer 3), the second functional group should have a structure similar to the structure in the hole injection layer 1. Examples of the second functional group include phenylamino, oxazole or carbazole group, or hydrazone site. The red-light-emitting dopant 5 may contain one or more of these functional groups.

When the underlying layer is the electrode of ITO or a metal, examples of the second functional group include hydroxyl (—OH), thiol (—SH), carboxyl (—COOH), sulfo (—SO$_3$H), I, Br, Cl, F, SCN, CN, NH$_2$, NO$_2$ or bipyridyl group. The red-light-emitting dopant 5 may contain one or more of these functional groups.

The group may be introduced to the major skeleton directly, as illustrated by Formula 6, or indirectly via an alkyl chain in consideration of the molecular size.

When the red-light-emitting dopant 5 does not incorporate with the second functional group, the red-light-emitting dopant 5 may be uniformity dispersed in the light-emitting layer 3. In this case, it is necessary to sufficiently reduce the concentration of the red-light-emitting dopant 5.

[Formula 9]

(Formula 6)

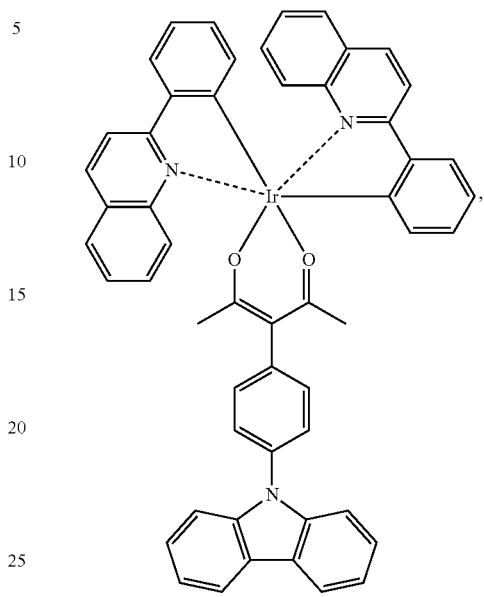

It is preferable that the solid concentration of the red-light-emitting dopant 5 is no more than 10 wt %. It is preferable that the weight-average molecular weight of the red-light-emitting dopant 5 is 500 or more and 3000 or less.

<Hole Injection Layer>

The hole injection layer 1 is used to improve the light-emitting efficiency and the life of the organic light-emitting device. Also, the hole injection layer 1 is used to buffer the concave and convex of the cathode. It is not absolutely necessary. A single layer or plural layers of the hole injection layer 1 may be provided.

Examples of the preferable material for the hole injection layer include electroconductive polymers, e.g., PEDOT (poly (3,4-ethylenedioxythiophene)) and polystyrenesulfonate, PSS. Polypyrrole-base and tirphenylamine-base polymers are also useful. They may be used in combination of low-molecular-weight material (whose weight-average molecular weight is 10,000 or less). Phthalocyanine-base and starburst-amine-base compounds are also applicable.

<Hole Transport Layer>

The hole transport layer 2 is comprised of a material having a function to transport holes, and an hole injection layer and a positive electron inhibition layer are included in the hole transport layer in a broad meaning. A single layer or plural layers of the hole transport layer 2 may be provided.

Examples of the material for the hole transport layer 2 include, but not limited to, starburst-amine-base compound, stilbene derivative, hydrazone derivative and thiophene derivative. They may be used in combination.

<Electron Transport Layer>

The electron transport layer 8 is responsible for donating electrons to the light-emitting layer 3. The electron injection layer 9 and a positive hole inhibition layer are included in the electron transport layer 8 in a broad meaning. A single layer or plural layers of the electron transport layer 8 may be provided.

Examples of the material for the electron transport layer 8 include bis(2-methyl-8-quinolinolate)-4-(phenylphenolate) aluminium (Balq), tris(8-quinolinolate) aluminum (Alq3), tris(2,4,6-trimethyl-3(pyridine-3-yl)phenyl) borane (3TPYMB), 1,4-Bis(triphenylsilyl)benzene (UGH2), oxadiazole derivative, triaszole derivative, fllerene derivative, phenanthroline derivative and quinoline derivative.

<Electron Injection Layer>

Electron injection layer 9 improves the efficiency of injection of the electrons from the cathode to the electron transport layer 8.

Examples of the preferable material for the electron injection layer 9 include, but not limited to, lithium fluoride, magnesium fluoride, calcium fluoride, strontium fluoride, barium fluoride, magnesium oxide and aluminum oxide. They may be used in combination.

<Substrate>

Examples of the substrate 10 include a glass substrate, a metal substrate and plastic substrates on which inorganic materials which are $SiO_2$, $SiN_x$, $Al_2O_3$ and the like are formed. Examples of the material for the metal substrate include alloys which are stainless, 42 alloy and the like. Examples of the material for the plastic substrate include polyethylene-terephthalate, polyethylene-naphthalate, polymethyl methacrylate, polysulfone, polycarbonate and polyimide.

<Anode>

The material for the anode is not limited so long as it has transparency and has a high work function. The examples include an electroconductive oxide, e.g., ITO or IZO, or metal of high work function, e.g., thin Ag. The electrode can be patterned normally on a substrate, e.g., glass, by photolithography.

<Cathode>

The cathode works to reflect light emitted from the light-emitting layer 3. Examples of the material for the cathode include, but not limited to, LiF/Al laminate and Mg/Ag alloy. LiF may be replaced by a Cs compound, Ba compound or Ca compound.

<Coating Solution>

The coating solution is composed of materials forming the light-emitting layer 3 dissolved in an adequate solvent. The following description explains that the host 4, the red-light-emitting dopant 5, the green-light-emitting dopant 6 and the blue-light-emitting dopant 7 are included in the coating solution as materials forming the light-emitting layer 3.

The solvents useful for the present invention are not limited so long as they can dissolve these components. The examples include aromatic hydrocarbons (e.g., toluene), ethers (e.g., tetrahydrofuran), alcohols, fluorine-base ones. These solvents may be used in combination for adjusting solubility and drying speed of each component. For example, a mixture of solvents of different boiling point (first solvent and second solvent) may be used, wherein the higher-boiling one (second solvent) is used as a rich solvent with the green-light-emitting dopant 6 or the blue-light-emitting dopant 7 to accelerate transfer of the green-light-emitting dopant 6 or the blue-light-emitting dopant 7 to the film surface. Solubility of the solvent is determined by liquid chromatography.

The coating methods for forming the light-emitting layer 3 include spin coating, casting, dip coating, spray coating, screen printing and ink-jet printing. One of the above method is selected to form the light-emitting layer 3.

The present invention is described in more detail by specific examples.

Example 1

Synthesis of Formula 4

First, the green-light-emitting dopant represented by Formula 4 was synthesized as one of the major constituents of the present invention to produce the organic white-light-emitting device of the present invention.

The compound represented by Formula 8 was synthesized as the essential intermediate for synthesizing the compounds represented by Formulae 4 by the following procedure.

A 200 mL three-necked flask was charged with 0.543 g of 2-phenylpyridine dissolved in 30 mL of ethoxyethanol and 0.418 g of iridium chloride dissolved in 10 mL of water, which were mixed with each other in the flask.

The mixture was heated at 120° C. for 10 hours under reflux in a nitrogen atmosphere, and then cooled to room temperature.

The solution was treated by evaporation, and then the resulting solid was washed with water and alcohol to produce the compound represented by Formula 8.

[Formula 10]

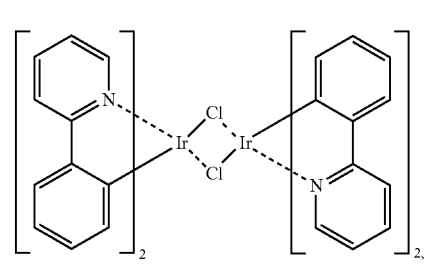

(Formula 8)

The compound represented by Formula 4 was synthesized by the following procedure.

A 200 mL three-necked flask was charged with 0.547 g of the compound represented by Formula 8, 0.512 g of 2,2-dimethyl-6,6,7,7,8,8,8-heptafluoro-3,5-octsanedione, 0.25 g of sodium carbonate and 30 mL of ethoxyethanol.

The mixture was heated at 115° C. for 10 hours under reflux in a nitrogen atmosphere, and then cooled to room temperature.

The solution was treated by evaporation, and then the resulting solid was washed with water and hexane.

The resulting material was treated by silica-gel column chromatography with a mixed solvent of ethyl acetate and hexane as the eluent to produce the compound represented by Formula 4. The compound represented by Formula 4 had a molecular weight of 796, determined by mass analysis.

A mixed film of the compound represented by Formula 4, the blue-light-emitting dopant and mCP as the host was formed on a quartz substrate by spin coating, with toluene as a solvent used to keep the solid concentration at 1 wt % and the compound represented by Formula 4 at 0.8 wt % and blue-light-emitting dopant at 10 wt % based on mCP.

The produced mixed film was beveled and machined surface of the mixed film was measured by TOF-SIMS. Therefore, as illustrated in FIG. 9(a), the blue-light-emitting dopant's concentration in the thickness direction of the light-emitting layer was nearly constant. In contrast, the green-light-emitting dopant's concentration on the surface of the light-emitting layer in the thickness direction of the light-emitting layer was high.

On the other hand, the mixed film which used Ir(ppy)2(acac) replaced by the compound represented by Formula 4 was measured similarly. Therefore, as illustrated in FIG. 9(b), the blue-light-emitting dopant's concentration and the green-light-emitting dopant's concentration in the thickness direction of the light-emitting layer were nearly constant.

<Preparation of Organic Light-Emitting Device>

Example 1 prepared the organic white-light-emitting device having a structure illustrated in FIG. 5.

MCP as the host, FIrpic as the blue-light-emitting dopant and the compound represented by Formula 4 or Ir(ppy)2(acac) as the green-light-emitting dopant dissolved in toluene were used as the coating solution to form the light-emitting layer. A weight ratio of each material is 100/10/0.8. The host, blue-light-emitting dopant and green-light-emitting dopant were dissolved in toluene, and then the coating solution was produced. The solid concentration of the coating solution was set to 1 wt %. The solid concentration of green-light-emitting dopant was 0.41 mol % in the coating solution. The solid concentration of green-light-emitting dopant was determined by liquid chromatography. The solution was used to form the organic light-emitting layer by spin coating.

Then, the electron transport layer of UGH2 and 3TPYMB was formed by vacuum vapor deposition. Then, the upper electrode of LiF/Al laminate was formed, to prepare the target organic white-light-emitting device.

A voltage was applied to the organic light-emitting device thus prepared to confirm that each of the green-light-emitting dopant and the blue-light-emitting dopant emitted light, as evidenced by the EL spectral pattern, and that the device emitted white light. On the other hand, the device was also prepared in the same manner except that the green-light-emitting dopant (Ir(ppy)2(acac)) contained no fluoroalkyl group for comparison. The device was confirmed to emit blue light of decreased intensity and green light of increased intensity.

Example 2

Synthesis of Formula 2

First, the blue-light-emitting dopant represented by Formula 2 was synthesized as one of the major constituents of the present invention to produce the organic white-light-emitting device of the present invention.

The compound represented by Formula 7 was synthesized as the essential intermediate for synthesizing the compounds represented by Formulae 2 by the following procedure.

A 200 mL three-necked flask was charged with 0.669 g of 2-(2,4-Difluorophenyl) Pyridine dissolved in 30 mL of ethoxyethanol and 0.418 g of iridium chloride dissolved in 10 mL of water, which were mixed with each other in the flask.

The mixture was heated at 120° C. for 10 hours under reflux in a nitrogen atmosphere, and then cooled to room temperature.

The solution was treated by evaporation, and then the resulting solid was washed with water and alcohol to produce the compound represented by Formula 7.

[Formula 10]

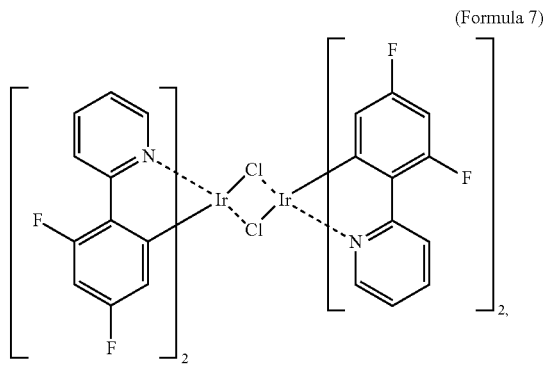

(Formula 7)

The compound represented by Formula 2 was synthesized by the following procedure.

A 200 mL three-necked flask was charged with 0.620 g of the compound represented by Formula 7, 0.512 g of 2,2-dimethyl-6,6,7,7,8,8,8-heptafluoro-3,5-octsanedione, 0.25 g of sodium carbonate and 30 mL of ethoxyethanol. The mixture was heated at 115° C. for 10 hours under reflux in a nitrogen atmosphere, and then cooled to room temperature.

The solution was treated by evaporation, and then the resulting solid was washed with water and hexane.

The resulting material was treated by silica-gel column chromatography with a mixed solvent of ethyl acetate and hexane as the eluent to produce the compound represented by Formula 2. The compound represented by Formula 2 is a low molecular weight material. The compound represented by Formula 2 had a molecular weight of 868, determined by mass analysis.

A mixed film of the compound represented by Formula 2, the red-light-emitting dopant and mCP as the host was formed on a quartz substrate by spin coating, with toluene as a solvent used to keep the solid concentration at 1 wt % and the compound represented by Formula 2 at 10 wt % and red-light-emitting dopant at 0.5 wt % based on mCP.

The produced mixed film was beveled and machined surface of the mixed film was measured by TOF-SIMS. Therefore, the red-light-emitting dopant's concentration in the thickness direction of the light-emitting layer was nearly constant. In contrast, the blue-light-emitting dopant's concentration on the surface of the light-emitting layer in the thickness direction of the light-emitting layer was high.

<Preparation of Organic Light-Emitting Device>

Example 2 prepared the organic white-light-emitting device having a structure illustrated in FIG. 3.

The lower electrode of ITO and the hole injection layer of PEDOT was formed by spin coating. A polymer material was used as the hole transport layer.

The organic light emitting layer was comprised of mCP (1,3-bis(carbazol-9-yl)benzene) as the host, the compound represented by Formula 2 as the blue-light-emitting dopant and Ir(piq)₂(acac) as the red-light-emitting dopant. A weight ratio of each material is 100/10/0.5. The host, blue-light-emitting dopant and red-light-emitting dopant were dissolved in toluene, and then the coating solution was produced. The solid concentration of the coating solution was set to 1 wt %. The solid concentration of red-light-emitting dopant was 0.29 mol % in the coating solution. The solid concentration of red-light-emitting dopant was determined by liquid chromatography. The solution was used to form the organic light-emitting layer by spin coating.

Then, the electron transport layer of UGH2 and 3TPYMB was formed by vacuum vapor deposition. Then, the upper electrode of LiF/Al laminate was formed, to prepare the target organic light-emitting device.

A voltage was applied to the organic light-emitting device thus prepared to confirm that each of the red-light-emitting dopant and the blue-light-emitting dopant emitted light, as evidenced by the EL spectral pattern, and that the device emitted white light. On the other hand, the device was also prepared in the same manner except that the blue-light-emitting dopant (FIracac) contained no fluoroalkyl group for comparison. The device was confirmed to emit blue light of decreased intensity and red light of increased intensity.

Example 3

Example 3 is described as below.

MCP as the host, FIrpic as the blue-light-emitting dopant, the compound represented by Formula 6 as the red-light-emitting dopant and the compound represented by Formula 4 as the green-light-emitting dopant dissolved in toluene were used as the coating solution to form the light-emitting layer. The organic light-emitting device was produced in the same manner as the example 1 and 2 except for the above coating solution.

A voltage was applied to the organic light-emitting device thus prepared to confirm that each of the red-light-emitting dopant, the green-light-emitting dopant and the blue-light-emitting dopant emitted light. On the other hand, the device was also prepared in the same manner except that the green-light-emitting dopant was Ir(piq)2(acac). The device was confirmed that the light intensity of the blue-light-emitting dopant was lower than that of the red-light-emitting dopant and the green-light-emitting dopant.

DESCRIPTION OF REFERENCE NUMERALS hole injection layer 1
hole transport layer 2
light-emitting layer 3
host 4
red-light-emitting dopant 5
green-light-emitting dopant 6
blue-light-emitting dopant 7
electron transport layer 8
electron injection layer 9
substrate 10
lower electrode 11
upper electrode 12
organic layer 13
first bank 104
second bank 105
resin layer 106
the seal substrate 107
light extracting layer 108

The invention claimed is:

1. A organic light-emitting device comprising:
   an upper electrode;
   a lower electrode; and
   a light-emitting layer positioned between the upper electrode and the lower electrode,
   wherein the light-emitting layer contains a host, a first dopant and a second dopant,
   a luminescent color of the first dopant and a luminescent color of the second dopant are different,
   the first dopant is a blue-light-emitting dopant or a green-light-emitting dopant,
   the first dopant has a first functional group,
   the first functional group makes the first dopant transfer toward the surface of the light-emitting layer on the upper electrode side in the light-emitting layer,
   and a peak position of the first dopant's concentration is between the upper electrode and the vertical center of the light-emitting layer, and
   wherein the first functional group is at least one species selected from the group consisting of fluoroalkyl, perfluoroalkyl, alkyl (of 10 carbon atoms or more), perfluoropolyether and siloxy groups.

2. The organic light-emitting device according to claim 1, wherein the first dopant is of the iridium complex represented by Formula 1

[Formula 1]

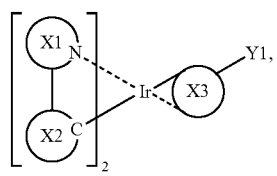

(Formula 1)

wherein X1 is an N-containing aromatic hetero ring, X2 is an aromatic hydrocarbon ring or aromatic hetero ring and X3 is acetylacetonate derivative, picolinate derivative or tetrakispyrazolyl borate derivative, Y1 is the first functional group.

3. The organic light-emitting device according to claim 1, wherein the second dopant has a second functional group, and the second functional group makes the second dopant transfer toward the surface of the light-emitting layer on the lower electrode side.

4. The organic light-emitting device according to claim 3, wherein the second functional group is at least one species selected from the group consisting of —OH, —SH, —COOH, —SO$_3$H, I, Br, Cl, F, SCN, CN, NH$_2$, NO$_2$ and bipyridyl groups.

5. The organic light-emitting device according to claim 3, wherein a hole injection layer is disposed between the lower electrode and the light-emitting layer,
and the second functional group is at least one species selected from the group consisting of phenylamino, oxazole, carbazole group, and hydrazone site.

6. The organic light-emitting device according to claim 1, wherein the light-emitting layer contains a third dopant, and a luminescent color of the third dopant is different from the luminescent color of the first dopant and the luminescent color of the second dopant.

7. The organic light-emitting device according to claim 1, wherein an absolute value of the lowest unoccupied molecular orbital energy of the blue-light-emitting dopant is higher than that of the green-light-emitting dopant when the second dopant is a blue-light-emitting dopant or a green-light-emitting dopant.

8. The organic light-emitting device according to claim 1, wherein the first dopant's concentration monotonically decreases from the peak position of the first dopant's concentration toward the lower electrode side in the thickness direction of the light-emitting layer.

9. The organic light-emitting device according to claim 3, wherein the peak position of the second dopant's concentration is on the lower electrode side in the center of the light-emitting layer in the thickness direction of the light-emitting layer,
and the second dopant's concentration monotonically decreases from the peak position of the second dopant's concentration toward the upper electrode side in the thickness direction of the light-emitting layer.

10. A coating solution used for forming the light-emitting layer for the organic light-emitting device according to claim 1,
containing a solvent, the host, the first dopant and the second dopant.

11. A luminescent material used for forming the light-emitting layer for the organic light-emitting device according to claim 1,
containing the host, the first dopant and the second dopant.

12. A light source device using the organic light-emitting device according to claim 1.

13. A method of organic light-emitting device comprising:
an upper electrode;
a lower electrode; and
a light-emitting layer positioned between the upper electrode and the lower electrode,
wherein the light-emitting layer contains a host material, a first dopant and a second dopant,
a luminescent color of the first dopant and a luminescent color of the second dopant are different,
the first dopant is a blue-light-emitting dopant or a green-light-emitting dopant,
the first dopant has a first functional group,
the first functional group makes the first dopant transfer toward the surface of the light-emitting layer on the upper electrode side,
a peak position of the first dopant's concentration is between the upper electrode and the vertical center of the light-emitting layer,
and the light-emitting layer is prepared by a coating method, and
wherein the first functional group is at least one species selected from the group consisting of fluoroalkyl, perfluoroalkyl, alkyl (of 10 carbon atoms or more), perfluoropolyether and siloxy groups.

14. The method of organic light-emitting device according to claim 13,
wherein the light-emitting layer contains a third dopant,
a luminescent color of the third dopant is different from the luminescent color of the first dopant and the luminescent color of the second dopant,
the first dopant, the second dopant and the third dopant are a red-light-emitting dopant, a green-light-emitting dopant or a blue-light-emitting dopant each other,
the solid concentration of the red-light-emitting dopant is less than 10 wt %,
the solid concentration of the green-light-emitting dopant is less than 10 wt %, and
the solid concentration of the blue-light-emitting dopant is 10 wt % or more and 30 wt % or less.

* * * * *